United States Patent [19]

Sherman

[11] Patent Number: 5,784,262
[45] Date of Patent: Jul. 21, 1998

[54] ARRANGEMENT OF PADS AND THROUGH-HOLES FOR SEMICONDUCTOR PACKAGES

[75] Inventor: John V. Sherman, Derby, Kans.

[73] Assignee: Symbios, Inc.

[21] Appl. No.: 554,111

[22] Filed: Nov. 6, 1995

[51] Int. Cl.⁶ .................................................. H05K 7/06
[52] U.S. Cl. ........................ 361/777; 361/767; 361/768; 174/261; 174/266
[58] Field of Search ............................... 361/767, 768, 361/777, 778, 760; 174/260–266; 439/68, 69; 257/723, 724, 730, 737, 738, 786, 697; 228/180.21, 180.22

[56] References Cited

U.S. PATENT DOCUMENTS

| | | | |
|---|---|---|---|
| 4,495,377 | 1/1985 | Johnson et al. | 361/777 |
| 4,893,216 | 1/1990 | Hagner | 361/774 |
| 4,912,603 | 3/1990 | Seyama | 361/777 |
| 5,065,282 | 11/1991 | Polonio | 439/68 |
| 5,216,278 | 6/1993 | Lin et al. | 257/688 |
| 5,342,999 | 8/1994 | Frei et al. | 174/266 |
| 5,379,191 | 1/1995 | Carey | 361/777 |
| 5,400,220 | 3/1995 | Swamy | 361/760 |
| 5,401,689 | 3/1995 | Frei et al. | 437/209 |
| 5,418,471 | 5/1995 | Kardos | 324/758 |
| 5,424,492 | 6/1995 | Petty et al. | 174/250 |
| 5,557,502 | 9/1996 | Banerjee et al. | 174/261 |
| 5,583,378 | 12/1996 | Marrs et al. | 257/730 |

Primary Examiner—Leo P. Picard
Assistant Examiner—John B. Vigushin
Attorney, Agent, or Firm—Jean M. Macheledt; Wayne P. Bailey

[57] ABSTRACT

An arrangement of mounting pads on a substrate having segments, at least one of which has a plurality of mounting pads in a first row. Mounting pads of the first row are in connection with a corresponding offset through-hole oriented outwardly in the same general direction as a bisector definable for that segment, or oriented outwardly in the same general direction as a diagonal of the arrangement's outer shape. The segment defined can have a second and third row of mounting pads. The arrangement could include second, third, fourth, and so on, segments each with a plurality of mounting pads. Also included is an arrangement of Ball Grid Array (BGA) mounting pads on a circuit board for connection with electrical contacts of a BGA package, having: a first segment of a plurality of mounting pads in a first row with each mounting pad of the first row in connection with an offset through-hole oriented outwardly in the same general direction as a bisector definable for that first segment. More segments may be desired to accommodate a BGA package with a large number of leads. Additionally included, is a layer of a multi-layer circuit board having an arrangement of conductively-lined through-holes for electrical connection between layers. This arrangement has a first and second segment, each having a plurality of generally parallel rows of through-holes; the spacing between these two segments being generally greater than that between adjacent rows within either segment. The conductive lining of each through-hole is in connection with a mounting pad located on an outer side of the layer. Each through-hole is offset in an outwardly direction from its interconnected mounting pad.

26 Claims, 5 Drawing Sheets

ARRANGEMENT OF PADS AND THROUGH-HOLES FOR SEMICONDUCTOR PACKAGES

BACKGROUND OF THE INVENTION

In general, the present invention relates to the arrangement of contact pads and associated through-holes, or vias, over an area of a substrate to which contacts of electrical components are attached. More particularly, this invention relates to a new board pad-through-hole arrangement having segments of outwardly directed rows of pad-through-hole combinations; and to a new arrangement of through-holes for electrical connection between circuit board layers, having segments of generally parallel rows of the through-holes.

Tiny semiconductor dice, commonly referred to as integrated circuit chips (ICs), are currently cut from a silicon wafer and packaged many different ways so that they can be electrically attached to other circuitry of a printed circuit board (PCB) or other second level packaging—also referred to as just "circuit board" or printed wiring board (PWB). Useful well known packaging technologies include quad flat packs (a type of peripheral lead package), wire bond, flip chip (whereby the IC chip is flipped over so that its active/top surface can be directly bonded to a PCB), pin grid array (PGA—which has a pattern of pins extending out through the package so that they can be inserted into correspondingly-located holes of a circuit board), and ball grid array (BGA) packaging. The latter, BGA packages, have solder balls instead of pins for registration with, and surface mounting to, conductive pads on a circuit board. There are advantages in using BGA packages: More BGA carrier leads can be accommodated over a given package area than for peripheral lead type packages (such as the quad flat pack); and BGA leads do not demand the tight tolerances required for pin/lead type packages.

As the size of equipment into which printed circuit boards are placed and connected continues to shrink (for example, personal computers that once required the entire space of a desk top, now fit into the palm of a human hand), circuit and PCB layout designers are required to fit more gates, components, and electrical connections (or traces) over the same, or smaller, area. As circuits are designed to carry out more, and more-complex, functions, the number of electrical contact points for power supply and input-output signals to and from ICs continues to increase. This demand for packages that can handle an increased number of electrical contact points, has helped BGA packaging gain popularity. Current BGA technology allows for up to about 400 ball-leads in a BGA package.

Printed circuit boards (PCBs) are typically made of one or more layers (multi-layer) of a substrate material, such as Teflon-glass, a polyamide, or other generally insulating material with structural integrity that can withstand relatively high temperatures. Additional layers allow for more interconnect traces to be incorporated into a PCB. It is along these interconnect traces that signals can travel from component to component or from layer to layer of a PCB. As is typical, the FIG. 1 multi-layer circuit board has two outwardly-facing layers 11a, 11b, along with interior "tiers" of signal traces, all laminated together. In multi-layer circuit boards, electrical signals are typically routed from layer to layer by through-holes, or vias. As can be better seen in FIG. 1, circuit board vias are typically lined with an inner layer of conductive material to electrically connect an associated pad to another circuit board layer. Openings for vias are usually formed by mechanically punching any one or many PCB layers prior to final assembly. Choice of conductive lining material (such as tungsten, copper, and gold) for vias depends upon the nature of the board-layer substrate used.

Semiconductors continue to be designed with more and more contact points. The multi-layer circuit boards to which these semiconductors are attached, therefore, require more associated pads and through-holes per unit area of circuit board than earlier designs.

Known pad-via arrangements fall short of accommodating both the increased package contact point density and corresponding increase in the number of signals requiring routing from one layer of a circuit board to another layer. U.S. Pat. No. 5,379,191 describes a square peripheral-to-area adapter having pads lined-up along each of the four sides of the square. Connected to the four peripheral rows of pads are reroute traces that fan-in toward a center point of the adapter. Each reroute trace ends in a via.

It is difficult to route traces between finely-pitched (i.e., closely-spaced) vias in a circuit board layer that employs a simple matrix (or squared-off array) of vias spatially offset from a corresponding matrix (or squared-off array) of electrically conductive flat pads or sockets. It is likewise difficult to route traces between vias in an inner layer of a circuit board, or between vias and pads in a board outer layer, having pad-via combinations randomly oriented in all directions.

Recently-issued U.S. Pat. No. 5,424,492 describes a "routing methodology" to address the problem of designing and building high I/O (input/output) density packaging: instead of dropping vias within the most populated portion of the package, such as the inner area of the pad grid (which is left empty of pads and vias), the attach pads on the top layer are configured around an edge of a grid as surface mount technology (SMT) pads; respective vias are not located in the densely populated inner area of the printed circuit board, but rather, as many top layer attach pads as possible are configured as SMT pads with their connecting traces/signal lines routed away from the package grid to less populated areas of the board.

U.S. Pat. No. 4,495,377 describes a ceramic substrate outer layer having a pattern of pads for connection with the C4 contacts of an integrated circuit chip. The pattern includes lines (not necessarily straight) of pads along the radial edges of segments of a polygon. The pads are connected to traces that are also located on the outer layer. No through-holes are mentioned or suggested, as they are unnecessary, for this design.

The new pad-through-hole arrangement described herein, having segments of outwardly directed rows of pad-through-hole combinations, makes it possible to efficiently connect IC packages (including BGA packages) with multiple leads. Both the new pad-through-hole arrangement and the new arrangement of through-holes for electrical connection between circuit board layers, as described herein, make routing of traces over board layers less difficult.

SUMMARY OF THE INVENTION

It is a primary object of this invention to provide a pad-through-hole arrangement over an area of a substrate to which contacts of electrical components (including BGA packages) are attached, that has segments of at least one outwardly directed row of pad-through-hole combinations. It is also an object of this invention to provide an arrangement of through-holes for electrical connection between circuit board layers, that has segments of generally parallel rows of the through-holes. It is also an object of this invention that the new arrangement of through-holes be adaptable for use within the area covered by an attached electrical component package.

The advantages of providing both the new pad-through-hole arrangements for an area of substrate and the new through-hole arrangements for a board layer, as described herein, are as follows: (a) IC packages having relatively densely-packed leads, such as BGA packages, can be accommodated so that signal trace routing is not prohibitively complex; (b) Ordering the arrangement of pad-through-hole combinations or through-holes, as done herein, makes is less difficult to route traces in a way that minimizes signal degradation; (c) Also, by providing for greater routing space between defined segments of an arrangement, more signal traces can be routed throughout the arrangement; (d) The ability to route more traces throughout an arrangement can reduce the number of substrate layers, or second level packaging, required; (e) Reducing the number of substrate layers leads to reduced overall board fabrication costs; (f) Design flexibility—more room to route traces provides for greater flexibility in designing board layout; and (g) Versatility—ordered pad-through-hole combination arrangements and through-hole arrangements that allow for trace routing flexibility are adaptable to many component packaging lead arrangements.

Briefly described, the invention includes an arrangement of mounting pads on a substrate for connection with electrical contacts. The arrangement has segments, at least one of which has a plurality of mounting pads in a first row. Mounting pads of the first row are in connection with a corresponding offset through-hole oriented outwardly in the same general direction as a bisector for that segment, or oriented outwardly in the same general direction as a diagonal of the arrangement's outer shape. This segment can have a second and third row of mounting pads. The arrangement may have a second segment with a plurality of mounting pads in a second segment first row, as well as a third segment with mounting pads, a fourth segment, and so on.

The invention also includes an arrangement of Ball Grid Array (BGA) mounting pads on a circuit board for connection with electrical contacts of a BGA package, having: a first segment having a plurality of mounting pads in a first row with each mounting pad of the first row in connection with an offset through-hole oriented outwardly in the same general direction as a bisector for that first segment. Likewise, the first segment can have a second and third row of mounting pads. Additional segments may be desired to accommodate a BGA package with a very large number of leads. This BGA package pad-through-hole arrangement can take the shape of a polygon with any number of sides.

Also characterized herein, is a layer of a multi-layer circuit board having an arrangement of conductively-lined through-holes for electrical connection between layers. This arrangement has a first and second segment, each having a plurality of generally parallel rows of through-holes. The spacing between these two segments is generally greater than that between adjacent rows within either the first or second segments. The conductive lining of each through-hole is in connection with a mounting pad located on an outer side of that, or any other, layer. Each through-hole is offset in an outwardly direction from its interconnected mounting pad. The through-hole arrangement might include, to accommodate many electrical connections between board layers, third and fourth segments of generally parallel rows of through-holes.

BRIEF DESCRIPTION OF THE DRAWINGS

The invention will be more particularly described by referencing the accompanying drawings of the preferred embodiments, in which like numerals designate like parts.

DETAILED DESCRIPTION OF THE PREFERRED EMBODIMENTS

Figure 1:
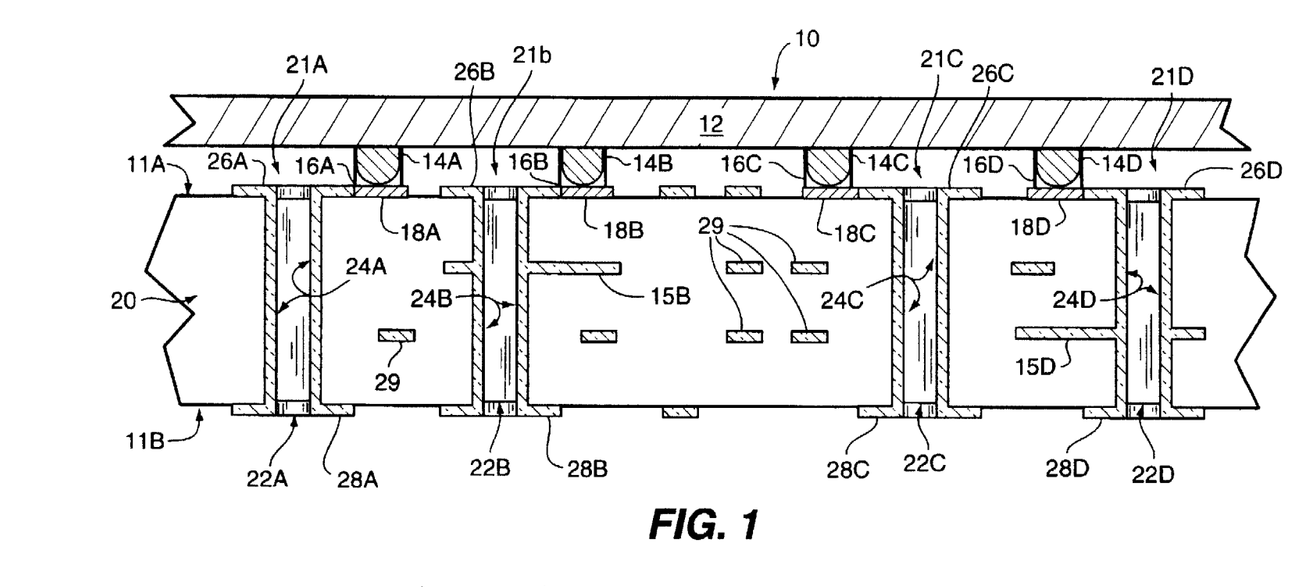
FIG. 1 is a partial sectional view (taken along 1—1 of the FIG. 7 pad-through-hole arrangement) of the invention illustrating a multi-layer circuit board or substrate base to which a BGA package, for example, has been registered and attached.

The partial sectional view, in FIG. 1, shows component assembly 10 with four of its leads 14a–14d attached by some means (such as solder shown at 16a–16d) to mounting pads 18a–18d located on an outer side of a multi-layer circuit board, or substrate member, 20 (cross-hatching intentionally left off of substrate member 20, for simplicity). The component 10 is shown with ball-shaped leads 14a–14d surface mounted to outer layer 11a of member 20, as is characteristic of the well known ball grid array (BGA) IC packaging technology discussed earlier. Leads 14a–14d can take some other shape, as long as the leads can be electrically connected to corresponding mounting pads. Although pads 18a–18d are shown planar, they could be indented to match a lead shape. Preferably, during assembly of a circuit board, electrical components attached to an outer surface 11a of a substrate base 20 are automatically (using currently-available equipment), or manually, picked-up and registered with the pads for soldering using known surface mounting techniques. Substrate openings, or through-holes, 22a–22d extend from outer side 11a to the other side 11b of base 20. These through-holes, referred to as vias, have been lined with a conductive material shown at 24a–24d. At each end of conductive linings 24a–24d is a ring-shaped via pad (shown at 26a–26d and 28a–28d). FIG. 1 shows ring-shaped via pads 26a–26d connected directly to mounting pads 18a–18d forming four pad-through-hole combinations labeled, respectively, as 21a–21d. As one can see, the pad-through-hole combination 21a', shown in FIGS. 2a and 2b with representative dimensions labeled, differs from the combinations 21a–21d of FIG. 1 in that 21a' has a short via pad (26a)-to-mounting pad (18a) interconnection trace 27a, not included in the pad-through-hole combinations of FIG. 1. Also shown in FIG. 1 are internal traces 15b, 15d connected to linings 24b, 24d, and internal traces all labeled 29.

FIG. 1 illustrates a multi-layer substrate member 20 with outer and inner/lower layers 11a, 11b. Multi-layer PCBs are made by laminating together multiple very thin layers (any reasonable number of layers, including interior tiers of signal traces, can be laminated) of fiberglass, or other suitable substrate, over which copper wiring, or other suitable conductive material, has been etched to form conductive traces. For example, an eight-layer PCB may have a total board thickness of 0.093". As the circuitry designed for a PCB becomes more complex, more board landscape is required for inter-device electrical connection. Circuit boards are designed to fit into electrical equipment. The space into which a PCB must fit, is typically limited. Due to overall size limitations, board designers building complex circuits usually opt to add board layers rather than increase overall PCB area. Adding board layers adds steps and materials to the PCB assembly process. As layers are added to a PCB, its cost to build increases. Therefore, it is desirable to fit all the necessary component-to-component and layer-to-layer electrical connections (traces) of a PCB into fewer layers.

Figure 2A:
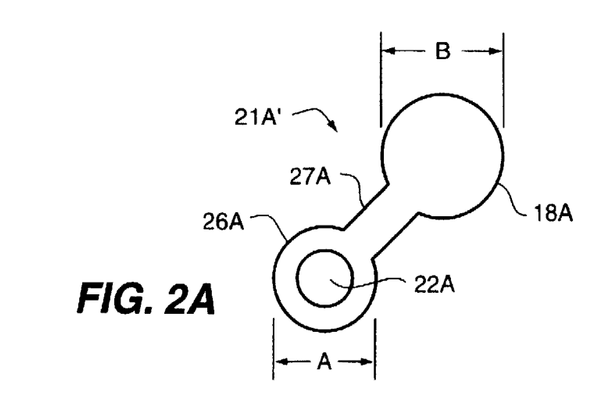
FIGS. 2a and 2b each show an enlarged top plan view of a pad-through-hole combination labeled 21a' that has a short interconnection trace between the pad and through-hole; representative dimensions, by way of example, are shown.
Figure 2B:
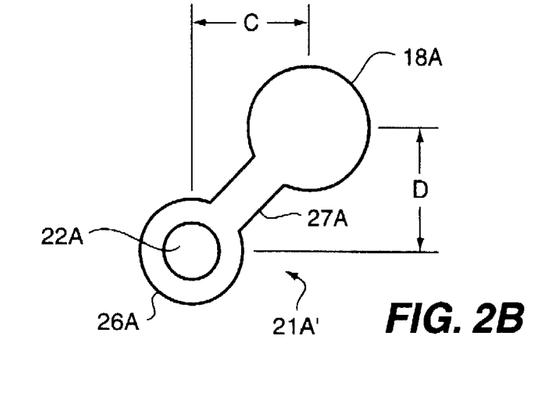

Turning, now, to the two views of an enlarged pad-through-hole combination labeled 21a' in FIGS. 2a and 2b, one can appreciate the small size of a pad-through-hole combination. A via pad (such as 26a, which need not necessarily be ring-shaped) has been connected to a mounting pad (such as 18a) using a short trace (such as trace 27a). By way of example only, representative dimensions of one pad-hole combination produced, are as follows: A is approximately 0.024"; the inner diameter of the conductive lining for hole 22a is approximately 0.012"; outer diameter B is approximately 0.03"; and center-to-center dimensions C and D are approximately 0.0295.

Figure 3:
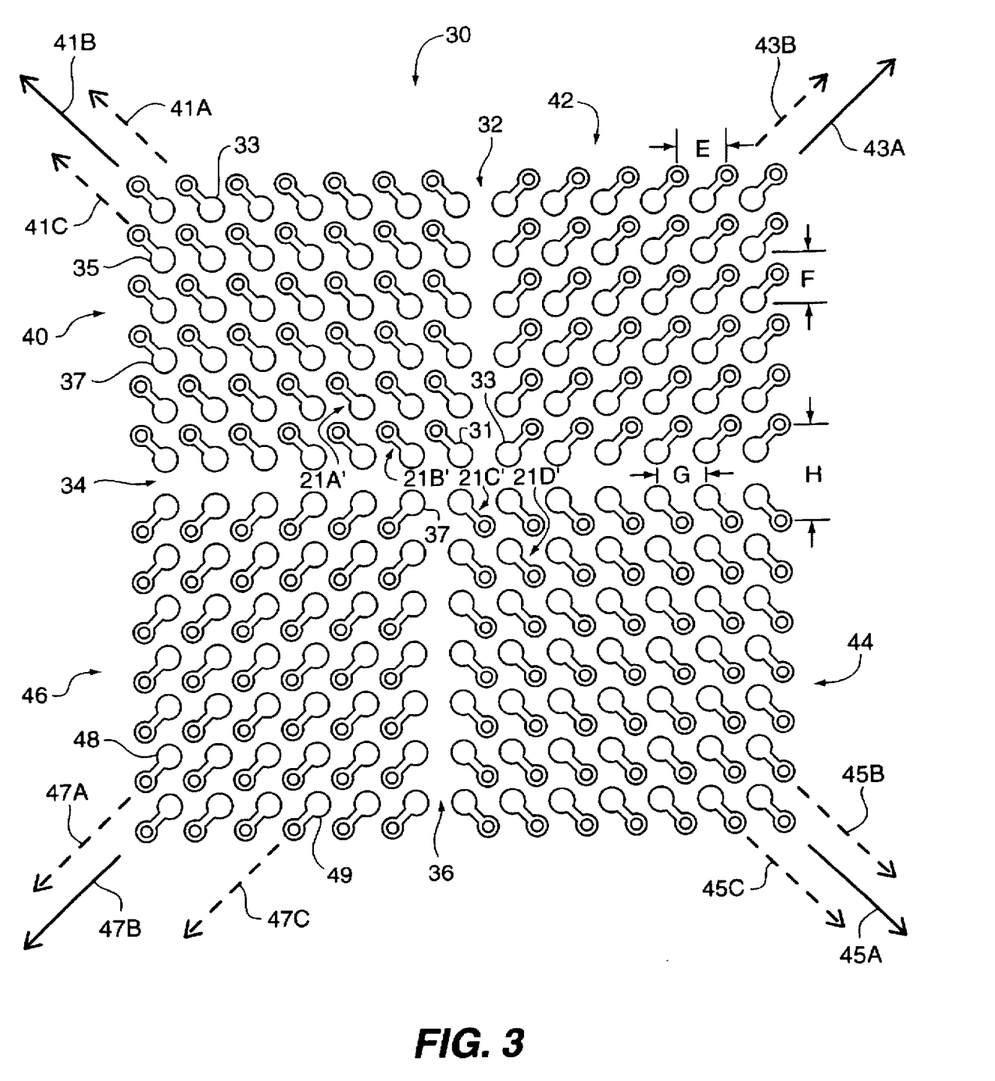
FIG. 3 is a top plan view of a preferred pad-through-hole arrangement of the invention having four segments, each with rows of pad-through-hole combinations.

The preferred four-sided polygon arrangement of pads connected to conductively lined through-holes, shown generally at 30 in FIG. 3, has four segments labeled 40, 42, 44, and 46. Each segment is generally defined by passages labeled 32, 34 (extending through arrangement 30), and 36. Arrows 41a, 41b, 41c all extend in the general direction of the bisector of rectangular segment 40. The bisector of segment 40 is the ray which bisects the 90 degree angle defined between passages 32 and 34: this bisecting ray extends from pad 31 (located nearby the point of the 90 degree angle) outwardly along arrow 41a. Likewise, as shown, arrows 45a, 45b, 45c all extend in the general direction of the bisector of rectangular segment 44—the bisector of segment 44 extends from the pad of pad-hole combination 21c' outwardly along arrow 45a. Arrows 47a, 47b, 47c all extend in the general direction of the bisector of rectangular segment 46—the bisector of segment 46 extends from pad 37 outwardly along arrow 47a. And finally, the bisector of rectangular segment 42 extends from pad 33 outwardly along arrow 43a.

By definition, the bisector of an angle is the ray dividing that angle into two equal angles. In defining the bisector of a segment of this invention, the angle of interest is the angle generally defined by the passages separating the centrally-located portion of a segment with respect to the general center-of-area of an arrangement of pads and through-holes containing that segment, from adjacent segments. For example, the bisector of segment 46 (as shown in FIG. 3) is definable as extending radially outward from pad 37. This is the case even if one truncates the upper left-hand, lower left-hand, or lower right-hand portions of segment 46. In referring to a bisector for segment 46 of four-sided arrangement 30, the angle of interest happens to be roughly 90 degrees. Also by definition, the two diagonals of four-sided arrangement 30 are located from corner-to-corner along solid arrow pairs 41b, 45a and 43a, 47b. As arrangement 30 has been designed, the bisectors of segments 40 and 46 do not fall along a diagonal of preferred arrangement 30; however, the bisectors of segments 42 and 44 do fall along a diagonal of this arrangement.

Segment 40 has a row of two pad-hole combinations labeled 21a', 21b'; each combination is comprised of a mounting pad in connection with a through-hole oriented outwardly along arrow 41b (which is in the same general direction of bisecting arrow 41a). Segment 40 has additional rows of pad-through-hole combinations, such as the two rows having mounting pads in connection with through-holes oriented outwardly along bisecting arrow 41a and arrow 41c (which is in the same general direction of bisecting arrow 41a). Segment 44 has a row of two pad-hole combinations labeled 21c', 21d'; each combination is comprised of a mounting pad in connection with a through-hole oriented outwardly along arrow 45a. Segment 44 has additional rows of pad-through-hole combinations, such as the two rows having mounting pads in connection with through-holes oriented outwardly along arrows 45b and 45c. The outermost mounting pads (such as those labeled as 33, 35, 48, 49) of any row of any segment could have, instead, a remote through-hole located in some other place on the layer to which the mounting pads of arrangement 30 are attached. If no through-hole is needed for any particular outermost pad (such as those labeled as 33, 35, 48, 49), that pad may not be connected to any through-hole.

As in FIGS. 2a and 2b, by way of example only, FIG. 3 provides representative dimensions: the center-to-center dimensions labeled E, F, and G are all approximately equal to 0.059"; and the center-to-center dimension labeled H is approximately 0.118". Although not necessary, the passages 32, 34, 36 between pad-hole combination segments 40, 42, 44, 46 are shown as generally greater than the spacing between adjacent rows of pad-hole combinations. This new design leaves extra room between pad-hole combination segments for routing traces over the substrate outer layer to which the pads in arrangement 30 have been attached. Note, also, that this new idea of orienting offset through-holes outwardly in the same general direction as a bisector for each segment, creates an even greater spacing between associated segments of through-holes (as better shown in FIG. 4) for routing traces therebetween. In the case of a four-sided pad-through-hole arrangement (such as the preferred and alternative arrangements in FIGS. 3 and 7), orienting offset through-holes radially outwardly along the general direction of a diagonal of the arrangement will also create greater spacing between associated through-hole arrangements (see FIG. 3 segments 42, 44 and FIG. 7 segment 244 for an example of this). Leaving extra room between adjacent segments is preferred if a component package having many mounting pads must be accommodated. Providing this extra room allows for more efficient trace routing—which can lead to fewer board layers and lower overall PCB cost.

Figure 4:
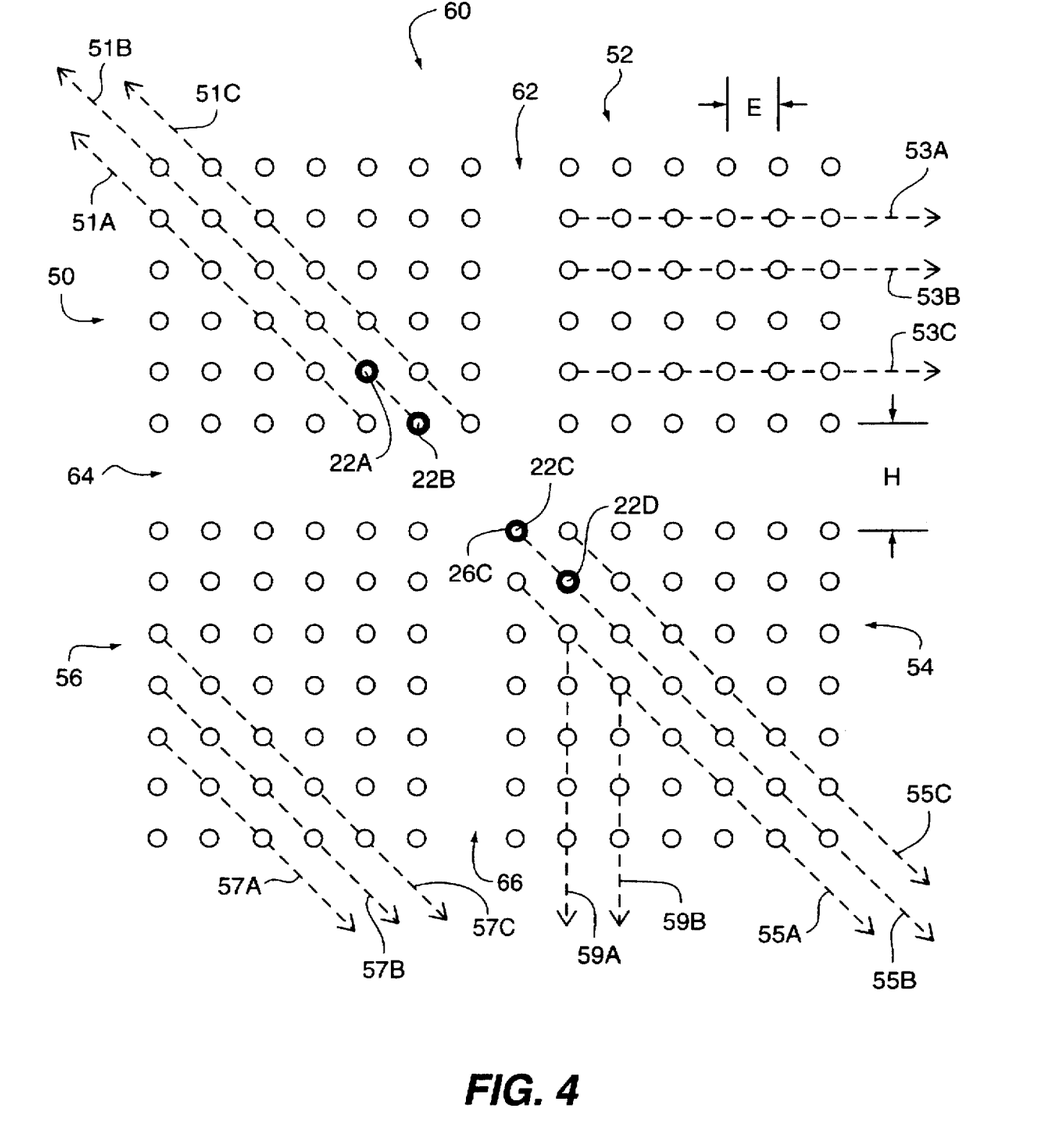
FIG. 4 is a top plan view of the preferred FIG. 3 arrangement shown without associated pads. This arrangement has four through-hole segments, each with generally parallel rows of through-holes.

The preferred four-sided polygon arrangement of through-holes shown generally at 60 in FIG. 4, has four segments labeled 50, 52, 54, and 56. Each segment is generally defined by a spacing labeled 62, 64 (extending through the arrangement), and 66. Segment 50 has rows of through-holes along generally parallel dashed lines (each ending in an arrow) 51a, 51b, 51c. Likewise, as specifically labeled: segment 52 has generally parallel rows of through-holes along dashed-lines 53a, 53b, 53c; segment 54 has generally parallel rows of through-holes along dashed-lines 55a, 55b, 55c as well as 59a, 59b; and finally, segment 56 has generally parallel rows of through-holes along dashed-lines 57a, 57b, 57c. The orientation of generally parallel rows of through-holes, within a segment, is not critical. Only four through-holes have been specifically labeled 22a–22d, each of which is shown with its respective via pad (for simplicity, only one via pad has been labeled here, 26c). Conductive linings, although not specifically visible in FIG. 4, can be added to each through-hole as shown in FIG. 1.

As discussed in connection with FIG. 3, representative through-hole center-to-center dimension E of FIG. 4 is approximately 0.059" and representative through-hole center-to-center dimension H of FIG. 4 is approximately 0.118". Preferably, the spacing between segments 50, 52, 54, 56 is generally greater than that between adjacent rows of through-holes, regardless of the direction of the rows. Orienting offset through-holes outwardly in the same general direction as a bisector for each segment of preferred FIG. 3 pad-hole arrangement 30, leaves even more room between through-hole segments for routing internal traces (such as those at 15b, 15d, 29 in FIG. 1), as well as for routing traces over an outer surface of a circuit board.

Figure 5:
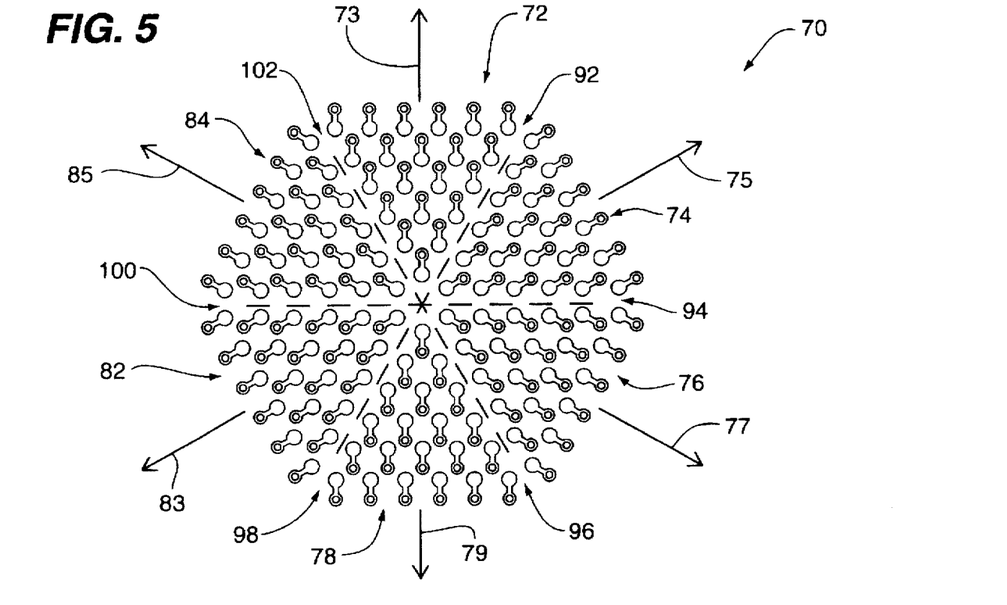
FIG. 5 is a top plan view of an alternative pad-through-hole arrangement of the invention having six segments, each with rows of pad-through-hole combinations.

The preferred hexagonal-shaped arrangement of pads connected to conductively lined through-holes, shown generally at 70 in FIG. 5, has six segments labeled 72, 74, 76, 78, 82, and 84. Each segment is generally defined by passages labeled 92, 94, 96, 98, 100, and 102. Arrows 73, 75, 77, 79, 83, and 85 all extend along the bisectors of triangular segments 72, 74, 76, 78, 82, and 84, respectively. By way of definition, the bisector of segment 72 is the ray which bisects the acute angle defined between adjacent passages 92 and 102. Segment 72 contains rows of mounting pads, each shown in connection with a through-hole oriented outwardly in the general direction of arrow 73. Likewise, as shown: the bisector of segment 74 is the ray which bisects the acute angle defined between adjacent passages 92 and 94—segment 74 contains rows of mounting pads, each shown in connection with a through-hole oriented outwardly in the general direction of arrow 75; the bisector of segment 76 is the ray which bisects the acute angle defined between adjacent passages 94 and 96—segment 76 contains rows of mounting pads, each shown in connection with a through-hole oriented outwardly in the general direction of arrow 77; and so on. As was discussed in connection with FIG. 3, the passages 92, 94, 96, 98, 100, and 102 between segments 72, 74, 76, 78, 82, and 84 are shown as generally greater than the spacing between adjacent rows of pad-hole combinations. As mentioned in connection with FIG. 3, orienting offset through-holes outwardly in the same general direction as a bisector definable for each segment creates an even greater spacing between associated segments of through-holes (as better shown in FIG. 6) for routing traces therebetween.

Figure 6:
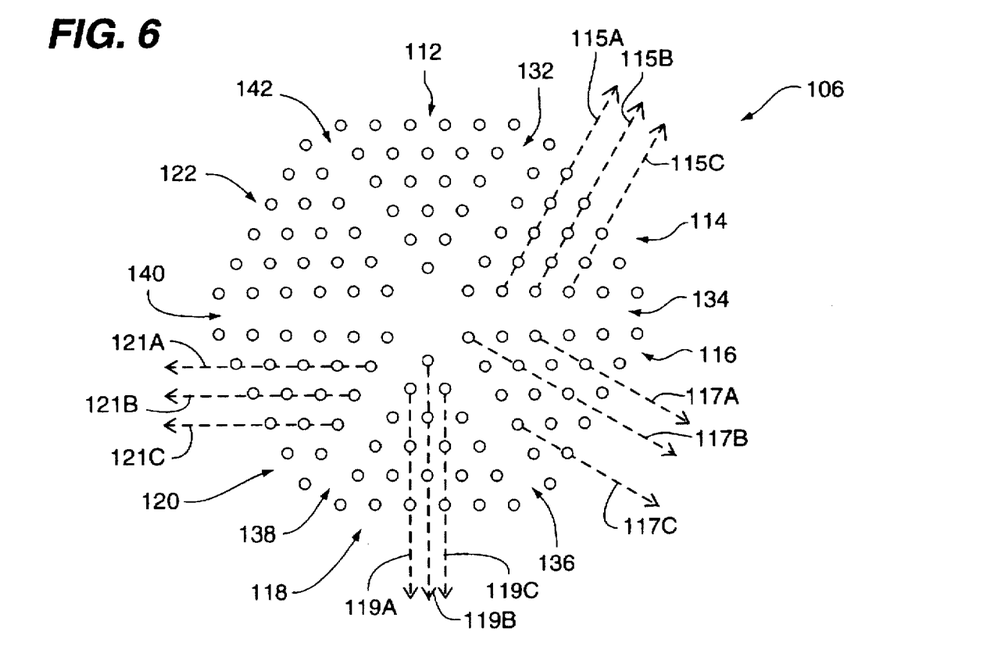
FIG. 6 is a top plan view of the FIG. 5 arrangement shown without associated pads. This arrangement has six segments, each shown with several rows of through-holes.

The preferred hexagonal-shaped arrangement of through-holes shown generally at 106 in FIG. 6, has six segments labeled 112, 114, 116, 118, 120, and 122. Each segment is generally defined by a spacing labeled 132, 134, 136, 138, 140, and 142. Segment 114 has rows of through-holes along generally parallel dashed lines 115a, 115b, 115c. Likewise, as specifically labeled: segment 116 has generally parallel rows of through-holes along dashed-lines 117a, 117b, 117c; segment 118 has generally parallel rows of through-holes along dashed-lines 119a, 119b, 119c; and finally segment 120 has generally parallel rows of through-holes along dashed-lines 121a, 121b, 121c. The orientation of generally parallel rows of through-holes within a segment, is not critical. Again as shown, preferably, the spacing between segments 112, 114, 116, 118, 120, and 122 is generally greater than that between adjacent rows of through-holes, regardless of the direction of the rows. As was mentioned in connection with the FIG. 4 through-hole arrangement, this design leaves extra room between segments for routing internal traces (such as those shown at 15b, 15d, 29 in FIG. 1), as well as for routing traces over an outer surface of a circuit board.

Figure 7:
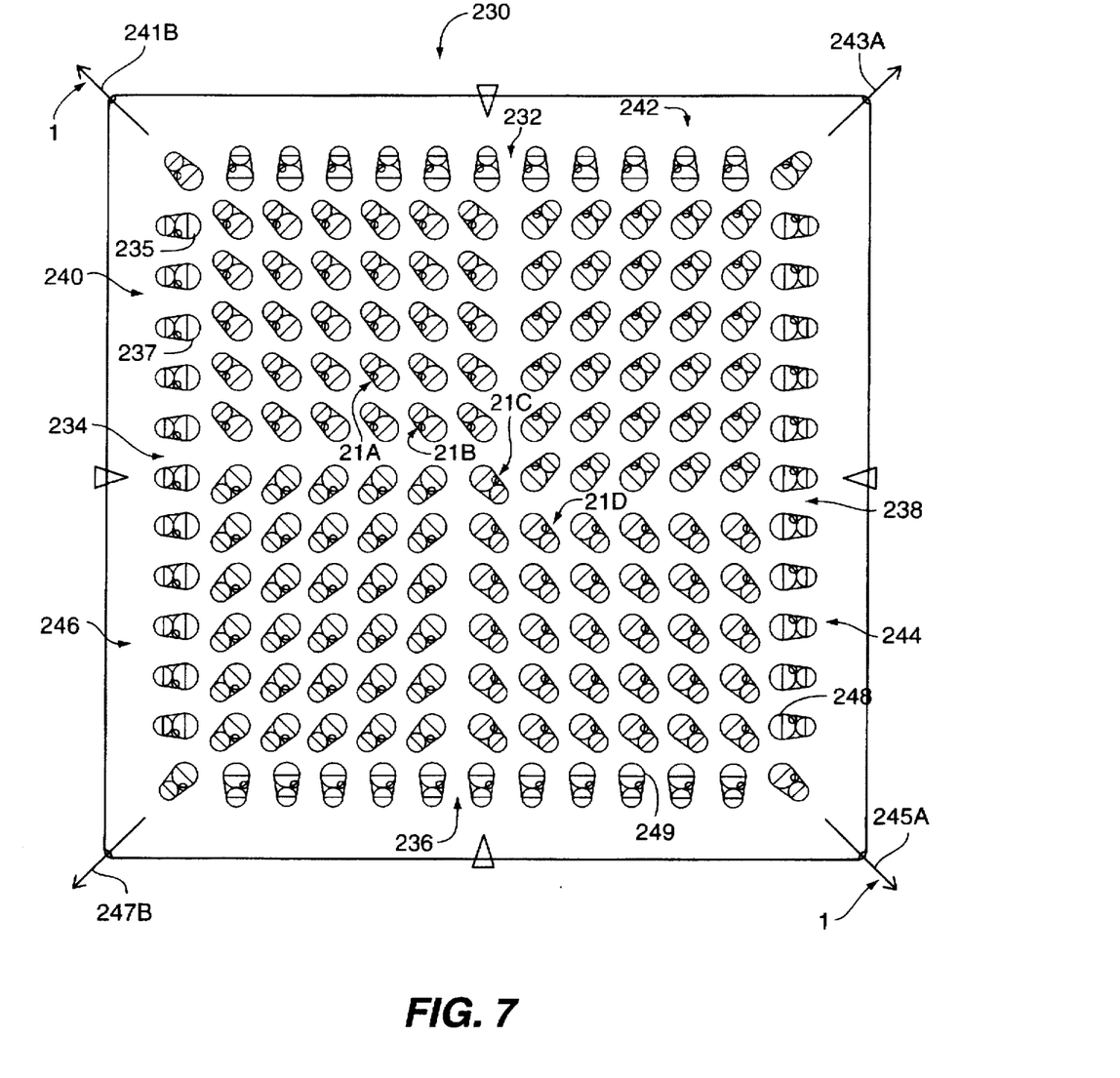
FIG. 7 is a top plan view of an alternative pad-through-hole arrangement of the invention having four segments, each with rows of pad-through-hole combinations. Many of these rows have an outermost mounting pad-through-hole combination oriented outwardly in a direction other than the orientation of inner pad-through-hole combinations.

An alternative four-sided arrangement of pads connected to conductively lined through-holes, shown generally at 230 in FIG. 7, has four segments labeled 240, 242, 244, and 246. Each segment is generally defined by passages labeled 232, 234, 236, and 238. Look back at FIG. 1 for a sectional view of pad-through-hole combinations 21a–21d which have very little, if any, interconnecting trace material between the mounting pad and the via pad. Pad-through-hole combinations labeled 21a, 21b each comprise a mounting pad in connection with a through-hole oriented outwardly generally along arrow 241b (arrow 241b is in the general direction of a bisector definable for segment 240). Segment 240 has additional rows, each with inner pad-through-hole combinations also oriented outwardly in the direction of arrow 241b. However, the outermost mounting pads (such as those labeled 235, 237) of these additional rows of segment 240 are in connection with a through-hole oriented in a direction other than that of arrow 241b. Alternatively, the through-holes connected to outermost mounting pads could be remotely located in some other area of the PCB. Pad-through-hole combinations 21c, 21d each comprise a mounting pad in connection with a through-hole oriented outwardly along arrow 245a (arrow 245a happens to both bisect segment 244, and run along a diagonal of arrangement 230). Segment 244 has additional rows, each with inner pad-through-hole combinations also oriented outwardly in the direction of arrow 245a. However, the outermost mounting pads (such as those labeled 248, 249) of these additional rows of segment 244 are in connection with a through-hole oriented in a direction other than that of arrow 245a.

The two diagonals of arrangement 230 are located along solid arrow pairs 241b, 245a and 243a, 247b. Center combination 21c could be oriented outwardly in any direction along either diagonal. As alternative arrangement 230 has been designed, the bisectors of segments 240 and 246 do not fall along either diagonal of arrangement 230. As mentioned above, orienting through-holes, as designed, outwardly from pads and in the same general direction as a pad-hole segment bisector, creates greater spacing between through-hole segments. Similar to FIG. 3, passages 232, 234, 236, 238 of arrangement 230 allow for extra trace routing clearance.

It is not critical that an arrangement of the invention have only four or six segments as particularly illustrated. The total number of segments is not critical. The outer shape of a pad-through-hole arrangement of the invention could have three, five, seven, eight, nine, ten, twelve, thirteen, and so on, number of sides. Note that the invention need not be limited to only arrangements having an outer shape of an even-number-sided polygon, as outwardly extending bisectors can be defined for segments of an outer shape having an odd-number of sides.

While certain representative embodiments and details have been shown for the purpose of illustrating the invention, those skilled in the art will readily appreciate that various modifications may be made to the invention without departing from the novel teachings or scope of this invention. Accordingly, all such modifications are intended to be included within the scope of this invention as defined in the following claims. In the claims, any means-plus-function clauses used are intended to cover the structures described herein as performing the recited function and not only structural equivalents but also equivalent structures.

What is claimed is:

1. An arrangement of mounting pads on a substrate for connection with electrical contacts, comprising:

a plurality of segments, a first segment of said plurality having a plurality of the mounting pads in a first row; and each of said first row mounting pads in connection with an offset through-hole oriented outwardly in a first direction that is substantially parallel to a first bisector for said first segment.

2. The arrangement of claim 1 wherein said first segment further comprises a plurality of the mounting pads in a second row, and each of said second row mounting pads is in connection with an offset through-hole oriented outwardly in said first direction.

3. The arrangement of claim 2 wherein said first segment further comprises a plurality of the mounting pads in a third row, and each of said third row mounting pads is in connection with an offset through-hole oriented outwardly in said first direction.

4. An arrangement of mounting pads on a substrate for connection with electrical contacts, comprising:

a plurality of segments;

a first segment of said plurality having a plurality of the mounting pads in a first row, a plurality of the mounting pads in a second row, and a plurality of the mounting pads in a third row;

each of said first row mounting pads, said second row mounting pads, and said third row mounting pads in connection with an offset through-hole oriented outwardly in a first direction that is substantially parallel to a first bisector for said first segment; and wherein each of said second and third rows has an outermost mounting pad in connection with an offset through-hole oriented outwardly in a direction other than said first direction.

5. The arrangement of claim 1 further comprising: a second segment of said plurality of segments, said second segment having a plurality of the mounting pads in a second segment first row, and each of said second segment first row mounting pads in connection with an offset through-hole oriented outwardly in a second direction that is substantially parallel to a second bisector for said second segment.

6. The arrangement of claim 5 wherein said second segment further comprises a plurality of the mounting pads in a second segment second row, and each of said second segment second row mounting pads is in connection with an offset through-hole oriented outwardly in said second direction.

7. The arrangement of claim 6 wherein said second segment further comprises a plurality of the mounting pads in a second segment third row, and each of said second segment third row mounting pads is in connection with an offset through-hole oriented outwardly in said second direction.

8. The arrangement of claim 5 further comprising: a third segment of said plurality of segments, said third segment having a plurality of the mounting pads in a third segment first row; and each of said third segment first row mounting pads in connection with an offset through-hole oriented outwardly in a third direction that is substantially parallel to a third bisector for said third segment.

9. The arrangement of claim 8 further comprising: a fourth segment of said plurality of segments, said fourth segment having a plurality of the mounting pads in a fourth segment first row; and each of said fourth segment first row mounting pads in connection with an offset through-hole oriented outwardly in a fourth direction that is substantially parallel to a fourth bisector for said fourth segment.

10. The arrangement of claim 8 further comprising:

a fourth segment of said plurality of segments, said fourth segment having a plurality of the mounting pads in a fourth segment first row and a plurality of the mounting pads in a fourth segment second row;

a fifth segment of said plurality of segments said fifth segment having a plurality of the mounting pads in a fifth segment first row and a plurality of the mounting pads in a fifth segment second row; and a sixth segment of said plurality of segments, said sixth segment having a plurality of the mounting pads in a sixth segment first row and a plurality of the mounting pads in a sixth segment second row.

11. An arrangement of Ball Grid Array (BGA) mounting pads on a circuit board for connection with electrical contacts of a BGA package, comprising:

a first segment having a plurality of the mounting pads in a first row; and each of said first row mounting pads in connection with an offset through-hole oriented outwardly in a first direction that is substantially parallel to a first bisector for said first segment.

12. The arrangement of claim 11 wherein said first segment has a plurality of the mounting pads in a second row and a plurality of the mounting pads in a third row, and each of said second and third rows has an outermost mounting pad in connection with an offset through-hole oriented outwardly in a direction other than said first direction.

13. The arrangement of claim 11 further comprising: a second segment having a plurality of the mounting pads in a second segment first row; and each of said second segment first row mounting pads in connection with an offset through-hole oriented outwardly in a second direction that is substantially parallel to a second bisector for said second segment.

14. The arrangement of claim 13 generally having an outer shape of a four-sided polygon.

15. The arrangement of claim 13 generally having an outer shape of a six-sided polygon.

16. The arrangement of claim 11 further comprising:

a second segment having a plurality of the mounting pads, each in connection with an offset through-hole, in a second segment first row;

a third segment having a plurality of the mounting pads, each in connection with an offset through-hole, in a third segment first row; and a fourth segment having a plurality of the mounting pads, each in connection with an offset through-hole, in a fourth segment first row.

17. The arrangement of claim 11 further comprising at least one BGA package connected to at least a portion of the mounting pads.

18. An arrangement of mounting pads on a substrate for connection with electrical contacts, comprising:

a first segment having a plurality of the mounting pads in a first row;

each of said first row mounting pads in connection with an offset through-hole oriented outwardly in a first direction that is substantially parallel to a diagonal of an outer shape of the arrangement; and a second segment having a plurality of the mounting pads in a second segment first row, each of said second segment first row mounting pads in connection with an offset through-hole oriented outwardly in a second direction that is substantially parallel to a second bisector for said second segment.

19. The arrangement of claim 18 wherein said first segment has a plurality of the mounting pads in a second row and a plurality of the mounting pads in a third row, each of said first segment mounting pads in said second and third rows in connection with an offset through-hole oriented outwardly in said first direction, and further comprising:

a third segment having a plurality of the mounting pads, each in connection with an offset through-hole, in a third segment first row; and a fourth segment having a plurality of the mounting pads, each in connection with an offset through-hole, in a fourth segment first row.

20. A layer of a multi-layer circuit board having an arrangement of conductively-lined through-holes for electrical connection between layers, the arrangement comprising:

a first and second segment, each having a plurality of generally parallel rows of the through-holes;

the spacing between said first and second segments being generally greater than that between said rows within either of said first and second segments;

said conductive lining of each of the through-holes is in connection with a mounting pad located on an outer side of the layer; and each of said through-holes of said first segment is offset from said interconnected mounting pad in an outwardly direction that is substantially parallel to a first bisector for said first segment.

21. The layer of claim 20 wherein the arrangement further comprises a third segment having a plurality of generally parallel rows of the through-holes, the spacing between said first, second, and third segments being generally greater than that between said rows within said first segment.

22. The layer of claim 21 wherein the spacing between said rows within said second segment and the spacing between said rows within said third segment is generally equal to that between said rows within said first segment.

23. The layer of claim 21 wherein the arrangement further comprises a fourth segment having a plurality of generally parallel rows of the through-holes, the spacing between said first and fourth segments being generally greater than that between said rows within said first segment.

24. The layer of claim 23 wherein the spacing between said first, second, third, and fourth segments is generally equal.

25. The layer of claim 23 wherein the arrangement generally has an outer shape of a six-sided polygon.

26. The layer of claim 20 wherein the arrangement generally has an outer shape of a four-sided polygon, and the arrangement further comprises a third segment having a plurality of generally parallel rows of the through-holes and a fourth segment having a plurality of generally parallel rows of the through-holes, the spacing between said first, second, third, and fourth segments being generally greater than that between said rows within said first segment.

* * * * *